(12) United States Patent
Straub et al.

(10) Patent No.: US 12,217,990 B2
(45) Date of Patent: Feb. 4, 2025

(54) METHOD FOR TREATING OBJECTS AND APPARATUS FOR CARRYING OUT THE METHOD

(71) Applicant: RENA Technologies GmbH, Guetenbach (DE)

(72) Inventors: Benedikt Straub, Guetenbach (DE); Markus Uihlein, Guetenbach (DE); Florian Kaltenbach, Guetenbach (DE); Stephan Alexis Pediaditakis, Guetenbach (DE)

(73) Assignee: RENA Technologies GmbH, Gütenbach (DE)

( * ) Notice: Subject to any disclaimer, the term of this patent is extended or adjusted under 35 U.S.C. 154(b) by 903 days.

(21) Appl. No.: 16/972,258

(22) PCT Filed: Jun. 3, 2019

(86) PCT No.: PCT/DE2019/100488
§ 371 (c)(1),
(2) Date: Dec. 4, 2020

(87) PCT Pub. No.: WO2019/233526
PCT Pub. Date: Dec. 12, 2019

(65) Prior Publication Data
US 2021/0159105 A1      May 27, 2021

(30) Foreign Application Priority Data

Jun. 4, 2018   (DE) .............................. 102018113264

(51) Int. Cl.
*H01L 21/677*       (2006.01)
*B65G 13/02*        (2006.01)
(Continued)

(52) U.S. Cl.
CPC ........ *H01L 21/67706* (2013.01); *B65G 13/02* (2013.01); *H01L 21/6708* (2013.01); *H01L 31/186* (2013.01)

(58) Field of Classification Search
None
See application file for complete search history.

(56) References Cited

U.S. PATENT DOCUMENTS 3,953,276 A     4/1976 Glorioso et al.
6,699,356 B2 *  3/2004 Bachrach ............ H01L 21/6708
                                          156/345.21

(Continued)

FOREIGN PATENT DOCUMENTS

DE          19717511 A1     10/1998
DE       102007054090 A1     5/2009

(Continued)

OTHER PUBLICATIONS

Machine Generated English Translation of DE10-2011118441. Published May 16, 2013. (Year: 2013).*

(Continued)

*Primary Examiner* — Sylvia MacArthur
(74) *Attorney, Agent, or Firm* — Laurence A. Greenberg; Werner H. Stemer; Ralph E. Locher (57) ABSTRACT

In a method for treating objects, the objects are transported through a basin by a transporting device. Treatment solution is introduced into the basin by way of at least one feeding device, which is provided with upwardly directed outlet openings. The treatment solution is sprayed upwards by the upwardly directed outlet openings to form jets of treatment solution. The objects are transported through the basin over the upwardly directed outlet openings and a downwardly facing surface of the objects is brought into contact with the jets of treatment solution during the transport of the objects (Continued)

through the basin. There is also described a treatment apparatus for carrying out such a method.

9 Claims, 6 Drawing Sheets

(51) Int. Cl.
*H01L 21/67* (2006.01)
*H01L 31/18* (2006.01)

(56) References Cited

U.S. PATENT DOCUMENTS

| | | | |
|---|---|---|---|
| 8,894,803 B2* | 11/2014 | Ramirez | H01L 31/02363 |
| | | | 156/345.11 |
| 9,899,240 B2* | 2/2018 | Hashizume | H01L 21/6719 |
| 11,062,929 B2 | 7/2021 | Eckstein et al. | |
| 2004/0152319 A1 | 8/2004 | Yamagata et al. | |
| 2018/0374723 A1 | 12/2018 | Reber et al. | |
| 2021/0159105 A1* | 5/2021 | Straub | H01L 21/6708 |

FOREIGN PATENT DOCUMENTS

| | | |
|---|---|---|
| DE | 102011118441 A1 | 5/2013 |
| DE | 102015121636 A1 | 6/2017 |
| DE | 102016210883 A1 | 12/2017 |
| EP | 2060326 A3 | 5/2012 |
| JP | H06208984 A | 7/1994 |
| JP | 2690851 B2 | 12/1997 |
| JP | 2004207503 A | 7/2004 |
| JP | 2017069529 A | 4/2017 |

OTHER PUBLICATIONS

Machine Generated English Translation of DE10-2016210883. Published Dec. 21, 2017. (Year: 2017).*
Machine Generated English Translation of JP06208984. Published Jul. 26, 1994. (Year: 1994).*
Machine Generated English Translation of the description of DE102011118441A1. Published May 16, 2013. (Year: 2013).*
Machine Generated English Translation of the claim of DE102011118441A1. Published May 16, 2013. (Year: 2013).*
Machine Generated English Translation of the description of JP 2017-069529A. Published Apr. 5, 2017. (Year: 2017).*
Machine Generated English Translation of the claim of JP 2017-069529A. Published Apr. 5, 2017. (Year: 2017).*
Machine Generated English Translation of JP 06208984A. Published Jul. 26, 1994. (Year: 1994).*

* cited by examiner

METHOD FOR TREATING OBJECTS AND APPARATUS FOR CARRYING OUT THE METHOD

BACKGROUND OF THE INVENTION

Field of the Invention

The invention relates to a method for treating objects and to a treatment apparatus for carrying out a method of this type.

A treatment of the surfaces of objects by means of a treatment solution is used in different technical fields. Thus, for example, wet-chemical etching methods, inter alia, are used for the treatment of wafer surfaces in the solar cell industry.

The treatment of the surfaces of objects can be realized, for example, in the form of a dip treatment, a certain number of objects being dipped into a basin which is filled with the treatment solution, and remaining there for a predefined time duration. This is what is known as a batch method.

A further possibility is the treatment of the objects by means of what is known as an inline method. Here, the objects are transported on a transport apparatus through a basin, the treatment of the objects by means of the treatment solution taking place during the transport of the objects through the basin. In contrast to batch methods, in the case of which objects are normally treated on both sides due to the system, single-sided treatments of objects can be realized in various ways in the case of inline methods.

Both in the case of batch methods and in the case of inline methods, the quality of the treatment result can be dependent, inter alia, on the temperature and/or the chemical composition of the treatment solution in the area of the objects to be treated. If, for example, a build-up of heat and/or an oversaturation with reaction products occurs/occurs at the objects, this can have negative effects on the quality of the treatment result. In the case of an etching method, a reduction of the etching rate can occur in a case of this type, for example.

SUMMARY OF THE INVENTION

It is an object of the present invention to make improved quality of the treatment result possible in the case of a treatment of objects, in particular in the case of a single-sided treatment of objects.

According to the invention, said object is achieved by way of a method and by way of a treatment apparatus as claimed.

It is provided in the case of the method according to the invention for treating objects that
  objects to be treated are transported through a basin by means of a transport apparatus;
  treatment solution is introduced into the basin by means of at least one feed device which is provided with upwardly directed outlet openings, and the treatment solution is sprayed out upward here by means of the upwardly directed outlet openings with the configuration of treatment solution jets;
  the objects being transported through the basin above the upwardly directed outlet openings, and,
  during the transport of the objects through the basin, a downwardly pointing surface of the objects being brought into contact with the treatment solution jets.

The treatment apparatus according to the invention comprises
  a basin, in which a treatment solution can be arranged;
  a transport apparatus, by means of which objects to be treated can be transported in a transport direction through the basin;
  at least one feed device which is arranged in the basin and by means of which treatment solution can be introduced into the basin;
  the at least one feed device having upwardly directed outlet openings for spraying out the treatment solution upward.

By virtue of the fact that treatment solution is sprayed out upward by means of the at least one feed device with the configuration of treatment solution jets, it can be achieved that fresh or unused treatment solution for the treatment of objects is available at the objects to be treated which, as is often the case in a single-sided treatment method, are transported above the at least one feed device. A build-up of heat and/or an oversaturation with reaction products in the region of the objects to be treated can be avoided in this way, in particular because the treatment solution which is introduced via the at least one feed device into the basin can dissipate heat and/or discharge reaction products.

In contrast, a build-up of heat and/or an oversaturation with reaction products in the region of the objects to be treated cannot be avoided sufficiently effectively by way of downwardly oriented outlet openings which bring about spraying out of treatment solution jets in the direction of the basin bottom.

The wording that the objects are transported through the basin means neither that a surface of the objects has to be situated completely below a liquid level of a treatment solution which is arranged in the basin, nor that their surface has to be situated completely below a basin edge of the basin. Therefore, parts of the object upper surface or the entire object surface can fundamentally come to lie or be transported above the basin edge of the basin or the liquid level of the treatment solution.

Furthermore, the wording that the treatment solution jets are sprayed out upward does not necessarily mean that the treatment solution jets are sprayed out along the vertical. The treatment solution jets which are sprayed out upward can fundamentally be sprayed out upward with a deviation with respect to the vertical. The deviation is preferably at most 40°, particularly preferably at most 35°.

"Upwardly directed outlet openings" are to be understood to mean outlet openings which are arranged in such a way that a fluid, such as the treatment solution, can exit through said outlet openings upward, possibly with a deviation of the abovementioned extent with respect to the vertical.

The objects to be treated can be, for example, substrates, in particular wafers for the solar cell and/or semiconductor industry.

The objects to be treated preferably have a predefined width. It is particularly preferred if all objects to be treated have the same width. This makes processing of the objects which is favorable in terms of complexity possible.

The width of an object is to be understood to mean its extent in the transport plane and perpendicularly with respect to the transport direction; the term "transport plane" is to be understood to mean a plane, in which the objects are transported by means of the transport apparatus.

The objects are advantageously transported by means of the transport apparatus along a horizontal transport direction.

In the case of the transport of the objects through the basin, the basin is preferably filled with the treatment solution as far as the downwardly pointing surface of the objects or beyond this.

The treatment of the objects can be, in particular, a single-sided treatment, in the case of which the downwardly pointing surface of the objects is treated with the treatment solution. In other words, the method for treating the objects can be a method for the single-sided treatment of the downwardly pointing surface of the objects. In the case of a treatment of this type, the downwardly pointing surface of the objects is preferably not brought into contact with the treatment solution, or at least not in a targeted manner.

In the case where the treatment is a single-sided treatment, it is preferably provided that the transport apparatus is arranged and configured, and the basin is filled with the treatment solution, in such a way that, in the case of the transport, only the downwardly pointing surface of the objects comes into contact with the treatment solution.

Furthermore, the treatment of the objects can be, for example, an etching treatment. In this case, the treatment solution is expediently an etching solution. The treatment can take place, in particular, in such a way that, in the case of the treatment, an etching abrasion of at least 3 μm, preferably at least 5 μm, particularly preferably at least 6 μm, is achieved on the respective object.

In one preferred embodiment of the invention, the treatment of the objects takes place with the configuration of a meniscus of the treatment solution on the downwardly pointing surface of the objects.

During the transport of the objects through the basin, each point of the downwardly pointing surface of the objects is advantageously brought into contact with the treatment solution jets in such a way that, after running through the basin, each point of the downwardly pointing surface of the objects has been treated with the treatment solution jets for an equally long time and possibly equally as often. As a result, a homogeneous treatment result can be achieved on the downwardly pointing surface of the objects.

In a preferred way, the treatment solution jets are configured in treatment solution which is already contained in the basin. Here, the treatment solution jets advantageously bring about a circulation of the treatment solution which is already contained in the basin.

During the passage through the treatment solution which is already contained in the basin, the treatment solution jets can widen conically. In this case, the wording that the treatment solution is sprayed out upward by means of the upwardly directed outlet openings with the configuration of treatment solution jets can be understood in such a way that the cone axis of the respective treatment solution jet which is sprayed out has a deviation of preferably at most 40°, particularly preferably at most 35°, with respect to the vertical.

In one advantageous design variant, the at least one feed device is configured as a tube-in-tube system with an outer tube and an inner tube which is arranged in the outer tube. In said design variant, the treatment solution is advantageously introduced into the outer tube via downwardly directed outlet openings of the inner tube. Furthermore, the treatment solution jets are advantageously sprayed out of the outer tube upward into the basin.

Downwardly directed outlet openings of the inner tube make it possible that gas bubble-rich treatment solution can collect in the upper part of the inner tube. From there, the gas bubble-rich treatment solution or, in a targeted manner, only the collected gas can be discharged from the inner tube, for example via a discharge line which is connected to the inner tube. In this way, a situation can be achieved where the treatment solution which is introduced from the inner tube into the outer tube is low in gas bubbles or free from gas bubbles. In the case of a single-sided treatment of the objects, in particular, this has the advantage that a contamination of the upwardly pointing surface of the objects with the treatment solution which, for example, can be attributed to bursting gas bubbles can be avoided.

By way of a combination of downwardly directed outlet openings in the case of the inner tube and upwardly directed outlet openings in the case of the outer tube, a "labyrinth effect" can be achieved which makes an improved outflow behavior of the treatment solution from the at least one feed device possible. In particular, a more homogeneous outflow of the treatment solution from the at least one feed device can be achieved by way of the introduction of the treatment solution into the outer tube via downwardly directed outlet openings of the inner tube and the spraying out of the treatment solution jets from the outer tube.

It is particularly preferred if the inner tube has exclusively downwardly directed outlet openings for the introduction of the treatment solution into the outer tube.

The at least one feed device is expediently arranged below the transport apparatus. The at least one feed device is preferably oriented horizontally.

In the case of one advantageous refinement of the invention, the at least one feed device extends in the basin at least in sections, preferably completely, in a non-parallel manner with respect to the transport direction. In other words, it is advantageous if at least one part section of the at least one feed device does not extend parallel to the transport direction.

Furthermore, it can be provided that, at least in sections, the at least one feed device has a straight extent which is oriented obliquely with respect to the transport direction. In other words, at least one part section of the at least one feed device can have a straight extent which is oriented obliquely with respect to the transport direction. In a preferred way, said straight extent extends over the entire length of the at least one feed device.

Treatment solution jets which widen conically can advantageously be configured by means of the upwardly directed outlet openings of the at least one feed device.

In the case where said straight extent extends over the entire length of the at least one feed device, it is advantageous if the straight extent is oriented at an angle $\alpha$ with respect to the transport direction, for which angle $\alpha$ it is the case at least approximately that $\alpha = \arcsin((B-2R)/L)$, L being the length of the at least one feed device, B being the width of the objects to be treated, and R being the radius of the treatment solution jets at the level of a transport plane of the transport apparatus. In particular, an orientation of this type of the at least one feed device with regard to the transport direction can achieve a situation where, after running through the basin, each point of the downwardly pointing surface of the objects has been treated with the treatment solution jets for an equally long time.

Here, the expression "at least approximately" means that $\alpha$ can be exactly equal to $\arcsin((B-2R)/L)$ or can differ from said term slightly, for example by at most 10%, preferably by at most 5%.

As an alternative, it can be provided that the at least one feed device has a periodicity or comprises jumps parallel to the transport plane and perpendicularly with respect to the transport direction. For example, the at least one feed device can have a zigzag course. An "interrupted" embodiment of the feed device is also possible, in the case of which the feed device comprises a plurality of part pieces which, in particular, are spaced apart from one another and are arranged obliquely with respect to the transport direction.

In one advantageous embodiment of the invention, the at least one feed device has a plurality of upwardly directed outlet openings which are arranged spaced apart from one another in a longitudinal extent direction of the at least one feed device.

As mentioned above, the at least one feed device can be configured as a tube-in-tube system. In this case, the outer tube advantageously has the upwardly directed outlet openings for spraying out the treatment solution upward. In this case, the inner tube can have downwardly directed outlet openings, via which the treatment solution can be introduced into the outer tube.

The treatment apparatus expediently comprises at least one spacer element which is arranged between the inner tube and the outer tube. A spacer element of this type preferably serves to hold the two tubes at a predefined spacing from one another. Furthermore, it is expedient if a gap between the inner tube and the outer tube is sealed by means of one or more sealing elements.

In the present case, a tube is not necessarily to be understood to mean a hollow body with a circularly round cross-sectional shape. The respective tube can have, for example, a polygonal, in particular triangular or rectangular, cross-sectional shape or a round, in particular circularly round, elliptical or oval, cross-sectional shape. Furthermore, the inner and the outer tube do not necessarily have to have an identical cross-sectional shape. For example, the inner tube can have a round cross-sectional shape, whereas the outer tube has a rectangular cross-sectional shape.

In the case of an embodiment of the outer tube with a rectangular cross-sectional shape, in particular, the outer tube can be as wide as the objects to be treated, and can be oriented parallel to the transport direction. Here, the upwardly directed outlet openings of the outer tube can be distributed in such a way that, during operation of the apparatus or when the method is carried out, the downwardly pointing surface of the objects is loaded with the treatment solution homogeneously by way of the treatment solution jets.

In addition to the upwardly directed outlet openings, the at least one feed device can have downwardly directed and/or lateral outlet openings for spraying out the treatment solution downward and/or laterally. This makes a more homogeneous circulation of the treatment solution in the basin possible. In the case of one refinement of the at least one feed device as a tube-in-tube system, in particular, the outer tube can have said downwardly directed and/or lateral outlet openings.

"Downwardly directed outlet openings" are to be understood to mean outlet openings which are arranged in such a way that a fluid, such as the treatment solution, for example, can exit through said outlet openings downward, possibly with a deviation with respect to the vertical. The deviation is preferably at most 40°, particularly preferably at most 35°.

"Lateral outlet openings" are to be understood to mean outlet openings which are arranged in such a way that a fluid, such as the treatment solution, for example, can exit through said outlet openings laterally, possibly with a deviation with respect to the horizontal. Here, the deviation is preferably at most 40°, particularly preferably at most 35°.

In the case of one advantageous embodiment, the at least one feed device has a plurality of upwardly directed outlet openings which are arranged next to one another obliquely or perpendicularly with respect to the transport direction for spraying out the treatment solution upward. In this way, spatially further extended spraying out of the treatment solution into the basin and therefore a more homogeneous circulation of the treatment solution in the basin can be achieved. In the case of one refinement of the at least one feed device as a tube-in-tube system, in particular, the outer tube can have said outlet openings which are arranged next to one another obliquely or perpendicularly with respect to the transport direction.

In a preferred way, the transport apparatus has a plurality of transport rollers which are arranged behind one another in the transport direction. Furthermore, it is preferred if the at least one feed device is arranged below the transport rollers of the transport apparatus.

The upwardly directed outlet openings of the at least one feed device are advantageously arranged at the positions of the transport rollers, in relation to the transport direction. That is to say, as viewed from above, the outlet openings of the at least one feed device are concealed by way of the transport rollers. This can achieve a situation where the transport rollers are flowed around at least in sections by the treatment solution jets, as a result of which an improved circulation of the treatment solution in the region of the transport rollers can be achieved.

The transport rollers of the transport apparatus can be arranged, in particular, in such a way that their uppermost point is arranged in each case at the level of the basin edge.

The treatment apparatus expediently has a supply device for the introduction of the treatment solution into the at least one feed device. The supply device can comprise, inter alia, a supply line which is connected to the at least one feed device. In the case of one refinement of the at least one feed device as a tube-in-tube system, in particular, the inner tube can be connected to the supply line.

In one preferred refinement of the invention, the treatment apparatus has a degassing apparatus for the removal of gas bubbles and/or gas bubble-rich treatment solution from the at least one feed device. The degassing apparatus can have, inter alia, a discharge line which is connected to the at least one feed device. In the case of one refinement of the at least one feed device as a tube-in-tube system, in particular, the inner tube can be connected to the discharge line.

When the method is carried out, gas bubble-rich treatment solution or, in a targeted manner, only the collected gas can be discharged from the at least one feed device by means of the degassing apparatus. If gas bubble-rich treatment solution is discharged from the at least one feed device, the treatment solution can be introduced again into the at least one feed device after removal of the gas bubbles from the gas bubble-rich treatment solution.

The treatment apparatus is advantageously set up to transport the objects to be treated in a plurality of tracks next to one another along the transport direction. As a result, a high throughput can be achieved by way of the treatment apparatus. The treatment apparatus can be configured, for example, in such a way that it can realize a throughput of at least 500 objects per track and hour, preferably at least 700 objects per track and hour, particularly preferably at least 900 objects per hour. For example, the treatment apparatus can be set up to transport the objects to be treated in five tracks next to one another along the transport direction, and to realize a throughput of 1000 objects per track and hour.

The at least one feed device can be one of a plurality of in particular, structurally identical feed devices. Furthermore, the treatment apparatus can in each case have a dedicated feed device for each track.

Each of the feed devices is advantageously connected to the abovementioned discharge line of the degassing apparatus. Furthermore, it is expedient if each of the feed devices is connected to the abovementioned supply line of the supply device.

In the further text, the invention will be described in greater detail on the basis of figures. Here, where appropriate, identical or identically acting elements are provided with identical designations. The invention is not restricted to the embodiments which are shown in the figures, not even in relation to functional features. The previous description and the following description of the figures contain numerous features which are shown partially combined in multiples in the dependent claims. A person skilled in the art will also consider said features individually, however, and will combine them to form appropriate further combinations. In particular, said features can be combined in each case individually and in any desired suitable combination with the method according to the invention and/or the treatment apparatus according to the invention.

DETAILED DESCRIPTION OF THE INVENTION

Figure 1:
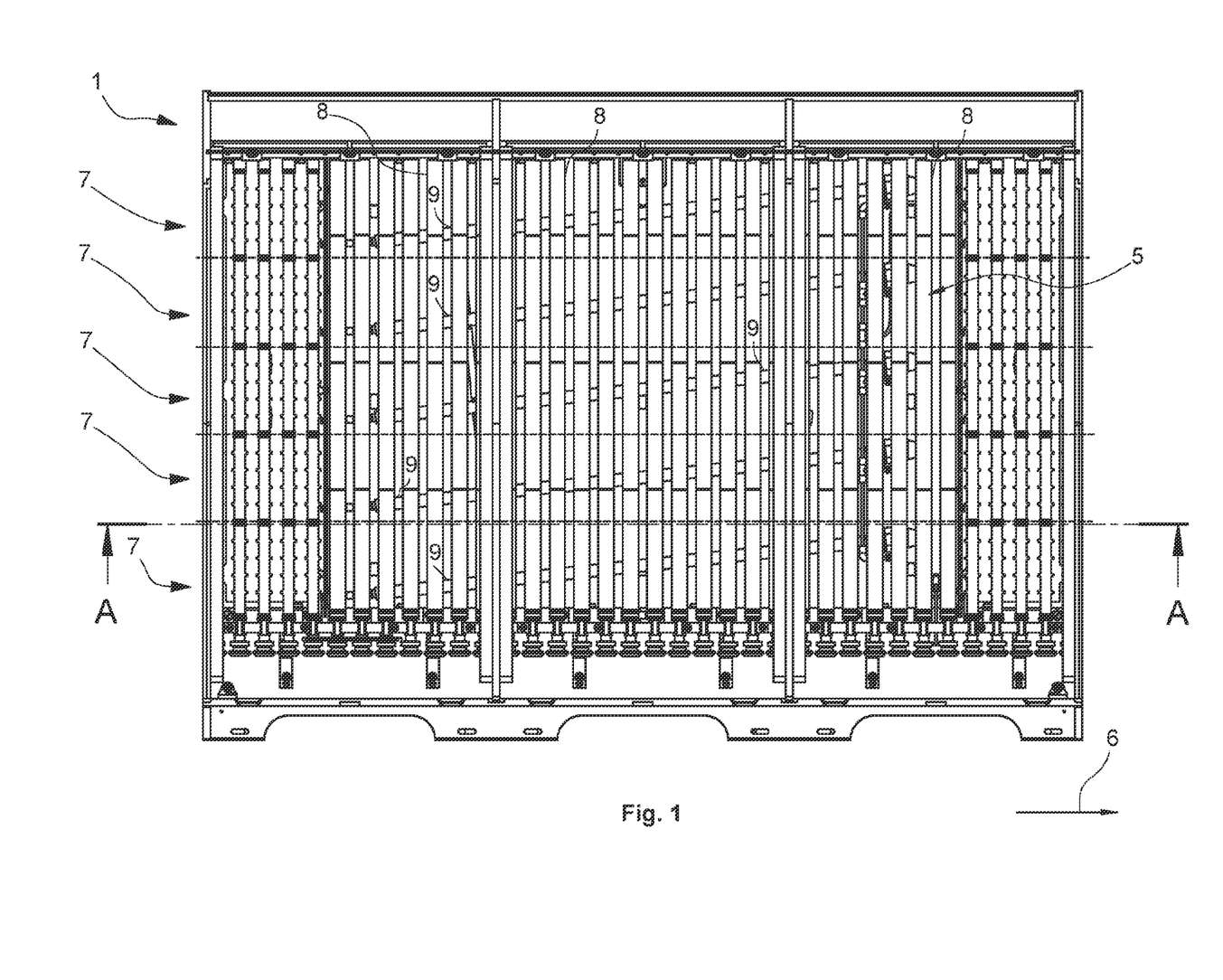
FIG. 1 shows one exemplary embodiment of a treatment apparatus according to the invention for carrying out the method according to the invention, in a plan view.

FIG. 1 shows one exemplary embodiment of a treatment apparatus 1 according to the invention for the single-sided treatment of objects 2, in a view from above.

The objects 2 to be treated (cf. FIG. 2) can be, for example, substrates, in particular wafers for the solar cell and/or semiconductor industry, the objects 2 not being shown in FIG. 1 for the sake of improved clarity.

Figure 2:
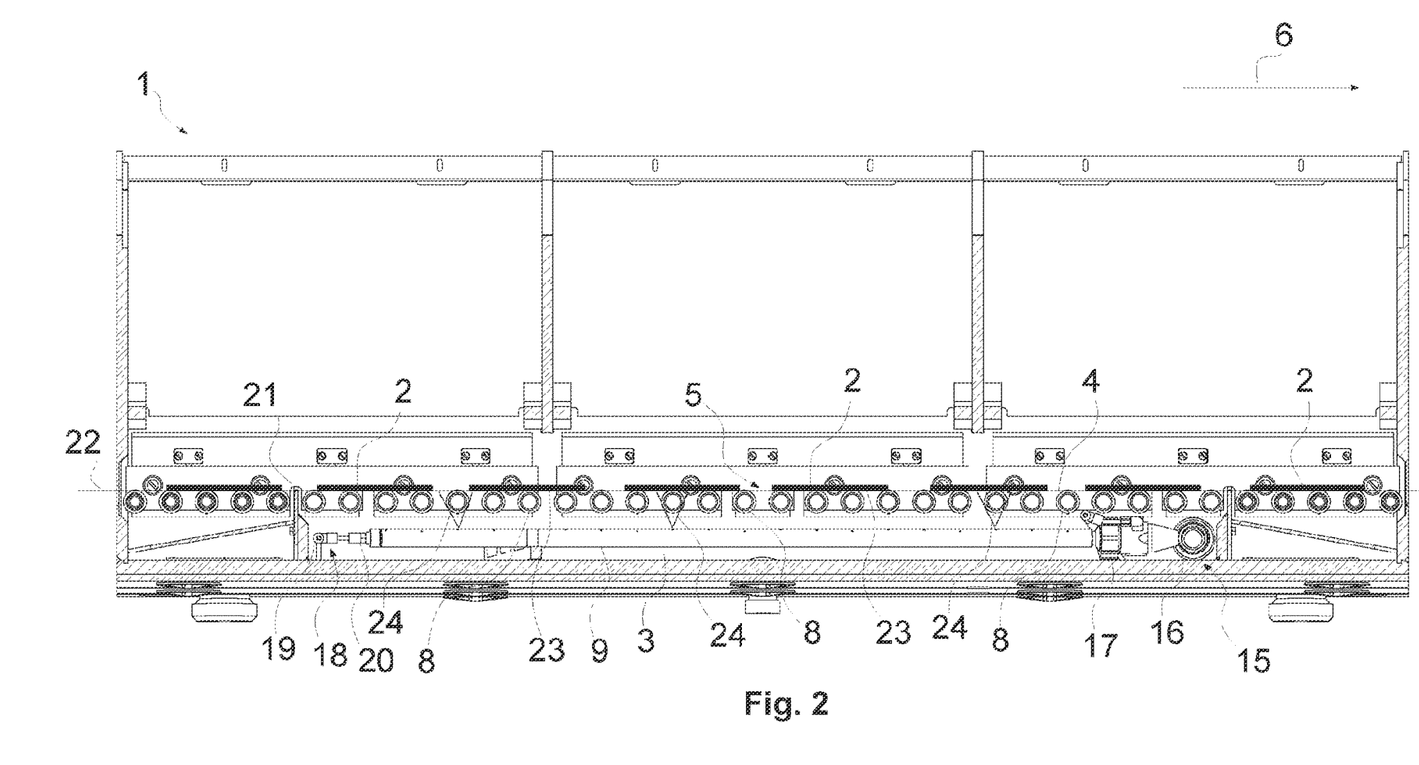
FIG. 2 shows a section through the treatment apparatus along the sectional plane A-A from FIG. 1.

The treatment apparatus 1 comprises a basin 3 for receiving a treatment solution 4, such as an etching solution, for example (cf. FIG. 2). Furthermore, the treatment apparatus 1 comprises a transport apparatus 5, by means of which the objects 2 to be treated can be transported along a horizontal transport direction 6 through the basin 3.

Furthermore, the treatment apparatus 1 is set up to transport the objects 2 to be treated by means of the transport apparatus 5 in a plurality of tracks 7 next to one another along the transport direction 6. In FIG. 1, dashed lines identify the lateral edges of the respective track 7.

As can be seen from FIG. 1, the transport apparatus 5 comprises a plurality of transport rollers 8 which are arranged behind one another in the transport direction 6 for the transport of the objects 2. The transport rollers 8 are oriented perpendicularly with respect to the transport direction 6, and are preferably arranged equidistantly with respect to one another.

Moreover, the treatment apparatus 1 comprises a plurality of feed devices 9, by means of which treatment solution 4 can be introduced into the basin 3. The feed devices 9 are arranged below the transport rollers 8. In addition, the feed devices 9 are preferably arranged at the same level, parallel to one another, and equidistantly with respect to one another. The treatment apparatus 1 in each case has a dedicated feed device 9 for each of the tracks 7. Since, in the present exemplary embodiment, the treatment apparatus 1 is set up to transport the objects 2 to be treated by means of the transport apparatus 5 in five tracks 7 next to one another, the treatment apparatus 1 correspondingly has five feed devices 9.

The respective feed device 9 has a straight extent 10 which extends over the entire length L of the respective feed device 9 (cf. FIGS. 3 to 5), and is oriented transversely with respect to the transport direction 6. In addition, each of the feed devices 9 is configured as a tube-in-tube system with an outer tube 11 and an inner tube 12 which is arranged in the outer tube 11 (cf. FIGS. 5 to 7).

The outer tube 11 of the respective feed device 9 has a plurality of upwardly oriented outlet openings 13 for spraying out the treatment solution 4 upward (cf., in particular, FIGS. 3, 4, 6 and 7). The outlet openings 13 are arranged in each case at the positions of the transport rollers 8, in relation to the transport direction 6, the respective outer tube 11 having, in the case of each transport roller 8, a plurality of upwardly oriented outlet openings 13 which are arranged next to one another. Since the transport rollers 8 are arranged above the feed devices 9, the outlet openings 13 of the respective outer tube 11 are concealed by way of the transport rollers 8 in FIG. 1 and are therefore not visible. The inner tube 12 of the respective feed device 9 has a plurality of downwardly oriented outlet openings 14 for the introduction of the treatment solution 4 into the associated outer tube 11 (cf. FIG. 7).

Furthermore, the treatment apparatus 1 comprises a supply device 15 for the introduction of the treatment solution 4 into the inner tube 12 of the respective feed device 9. The supply device 15 comprises a supply line 16, to which the feed devices 9 (more precisely, the inner tubes 12 of the feed devices 9) are connected in each case by means of a connector unit 17 (cf. FIG. 2).

Furthermore, the treatment apparatus 1 comprises a degassing apparatus 18 for the removal of gas bubbles and/or gas bubble-rich treatment solution from the feed devices 9. The degassing apparatus 18 has a discharge line 19 to which the feed devices 9 (more precisely the inner tubes 12 of the feed devices 9) are connected in each case by means of a connector unit 20 (cf. FIG. 2).

FIG. 2 shows a section through the treatment apparatus 1 along the sectional plane A-A from FIG. 1.

It can be seen from FIG. 2 that the transport rollers 8 of the transport apparatus 5 are arranged at the same level. In the present exemplary embodiment, the transport rollers 8 are arranged in such a way that their uppermost point is arranged in each case at the level of a basin edge 21 of the basin 3. That is to say, the transport plane 22, in which the objects 2 are transported by means of the transport apparatus 5, is situated at the level of the basin edge 21. This achieves a situation where objects 2 which are transported on the transport rollers 8 come into contact only on their downwardly pointing surface 23 with the treatment solution 4, with which the basin 3 is filled up to its basin edge 21.

The treatment of the objects 2 by means of the treatment solution 4 takes place during the transport of the objects 2 through the basin 3. In the case of the treatment, the objects 2 come into contact with the treatment solution 4 on their downwardly pointing surface 23.

Treatment solution 4 is introduced into the inner tubes 12 of the feed devices 9 via the supply line 16 of the supply device 15. The treatment solution 4 is introduced from the inner tube 12 of the respective feed device 9 via its downwardly directed outlet openings 14 into the associated outer tube 11. The treatment solution 4 is in turn sprayed out upward from the outer tube 11 of the respective feed device 9 via its upwardly directed outlet openings 13 with the configuration of treatment solution jets 24, of which some are shown diagrammatically by way of example in FIG. 2.

The treatment solution jets 24 are formed in the treatment solution 4 which is already contained in the basin 3, and come into contact with the objects 2 to be treated. During the passage through the treatment solution 4 which is already contained in the basin 3, the treatment solution jets 24 widen conically.

As has been mentioned above, the respective feed device 9 is oriented obliquely with respect to the transport direction 6. For the angle α, at which the respective feed device 9 lies with respect to the transport direction 6, it is the case at least approximately that $\alpha=\arcsin((B-2R)/L)$, L being the length of the respective feed device 9, B being the width of the objects 2 to be treated, and R being the radius of the treatment solution jets 24 at the level of the transport plane 22. In particular, an orientation of this type of the feed devices 9 relative to the transport direction 6 can achieve a situation where, during the transport of the objects 2 through the basin 3, each point of the downwardly pointing surface 23 of the objects 2 is brought into contact with the treatment solution jets 24 in such a way that, after running through the basin 3, each point of the downwardly pointing surface 23 of the objects 2 has been treated with the treatment solution jets 24 for an equally long time.

Gas bubbles which are contained in the treatment solution 4 which is fed into the inner tubes 12 of the feed devices 9 collect in the upper part of the respective inner tube 12. Gas bubble-rich treatment solution or possibly only the collected gas can be discharged via the discharge line 19 of the degassing apparatus 18, which discharge line 19 is connected to the inner tubes 12 of the feed device 9. Only treatment solution 4 which is low in gas bubbles or free from gas bubbles exits via the downwardly directed outlet openings 14 of the respective inner tube 12 into the associated outer tube 11, with the result that only treatment solution 4 which is low in gas bubbles or free from gas bubbles is sprayed out upward from said outer tube 11. In this way, the input of gas bubbles into the treatment solution 4 which is situated in the basin 3 is avoided or at least reduced.

Figure 3:
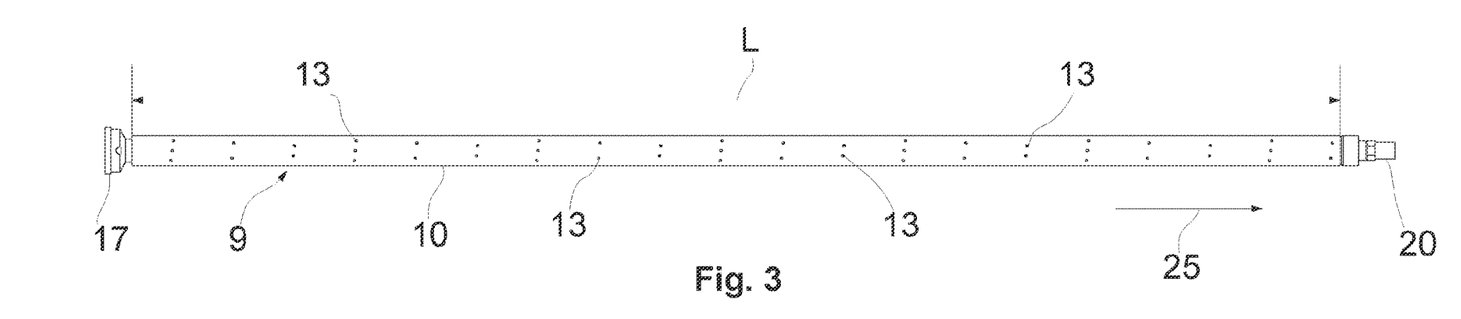
FIG. 3 shows a plan view of a feed device of the treatment apparatus.

FIG. 3 shows by way of example a plan view of one of the feed devices 9 of the treatment apparatus 1. Since the feed devices 9 of the treatment apparatus 1 are of structurally identical configuration with respect to one another, the following comments also apply analogously to the other feed devices 9 of the treatment apparatus 1.

In FIG. 3, the upwardly directed outlet openings 13 of the illustrated feed device 9, more precisely of its outer tube 11 (cf. FIG. 5), are visible. As can be seen from FIG. 3, the upwardly directed outlet openings 13 of the feed device 9 are distributed in the longitudinal extent direction 25 of the feed device 9 substantially over the entire length L of the feed device 9.

Furthermore, FIG. 3 depicts two connector units 17, 20, by means of which the feed device 9 in the treatment apparatus 1 is connected to the discharge line 19 of the degassing apparatus 18 and to the supply line 16 of the supply device 15, respectively. The connector unit 20, by means of which the feed device 9 is connected to the discharge line 19 of the degassing apparatus 18, is arranged in FIG. 3 at the right-hand end of the feed device 9, whereas the connector unit 17, by means of which the feed device 9 is connected to the supply line 16 of the supply device 15, is arranged at the left-hand end of the feed device 9.

Figure 4:
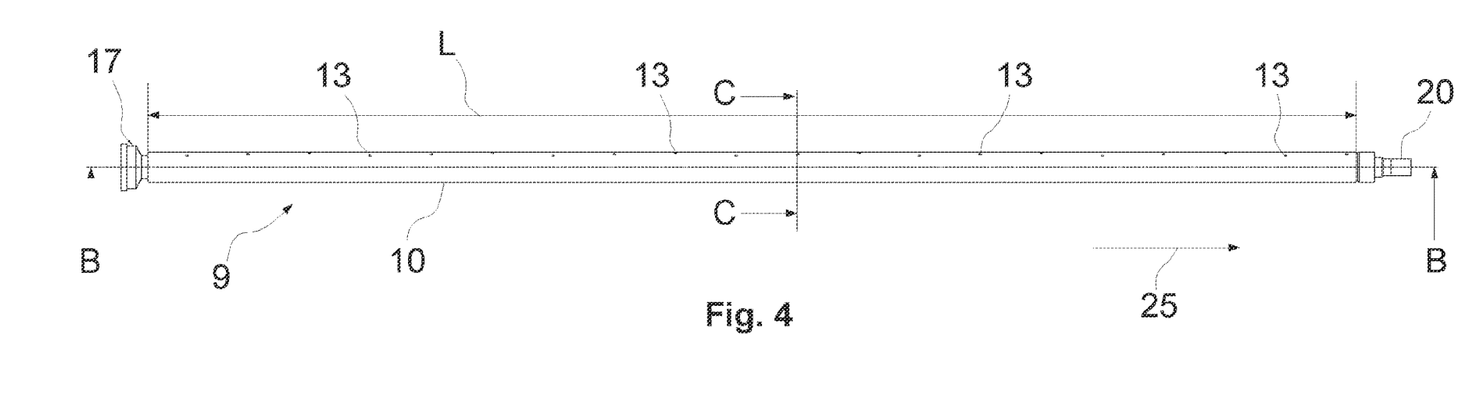
FIG. 4 shows a side view of the feed device from FIG. 3.

FIG. 4 shows a side view of the feed device 9 from FIG. 3. Moreover, FIG. 4 also shows the two said connector units 17, 20.

Figure 5:
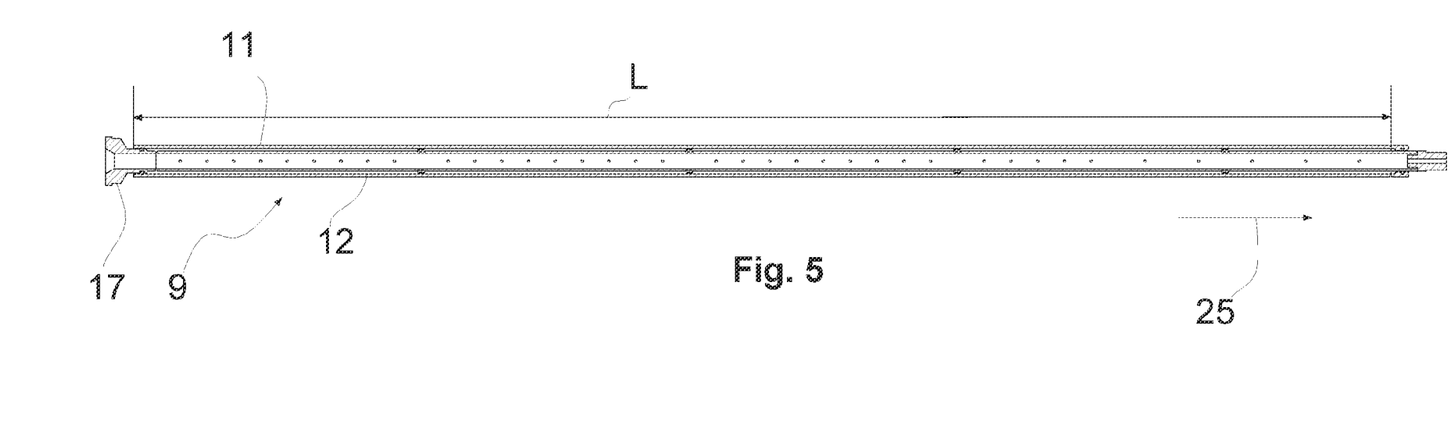
FIG. 5 shows a section through the feed device along the sectional plane B-B from FIG. 4 (longitudinal section)
Figure 6:
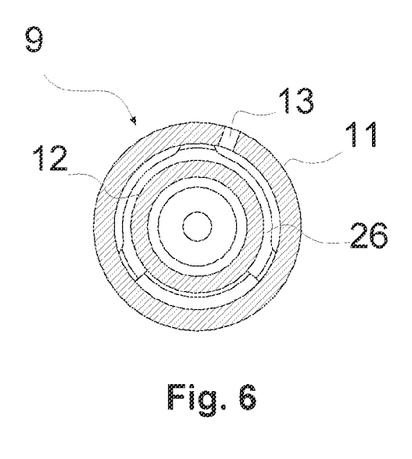
FIG. 6 shows a section through the feed device along the sectional plane C-C from FIG. 4 (cross section)
Figure 7:
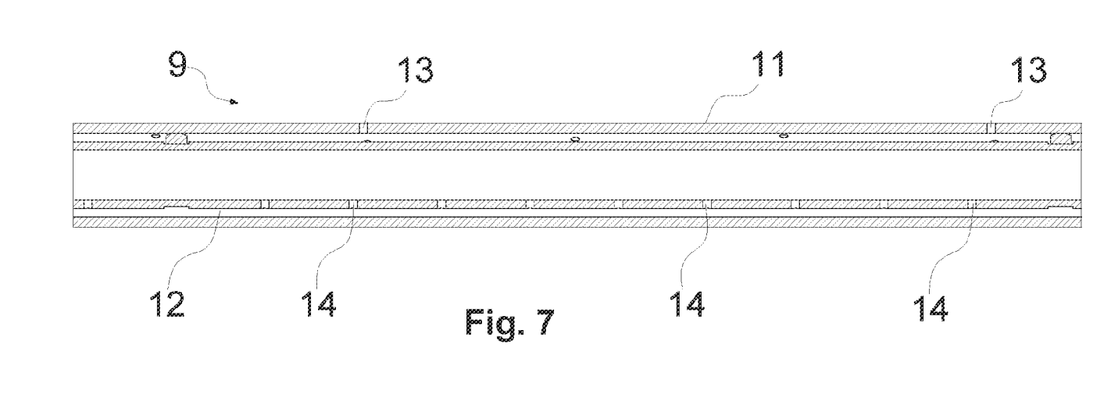
FIG. 7 shows an enlarged detail of the sectional illustration from FIG. 5 (detailed longitudinal section).

Furthermore, two sectional planes (sectional planes B-B and C-C), to which the sectional illustrations of FIGS. 5 to 7 relate, are illustrated in FIG. 4.

FIG. 5 shows a section through the feed device 9 from FIG. 3 and through the connector units 17, 20 which are arranged on said feed device 9 along the sectional plane B-B.

In FIG. 5, apart from the outer tube 11 (already visible in FIG. 3 and FIG. 4) of the feed device 9, its inner tube 12 is also visible.

FIG. 6 shows a section through the feed device 9 from FIG. 3 along the sectional plane C-C.

FIG. 6 depicts the outer tube 11 and the inner tube 12 of the feed device 9 in cross section. One of the upwardly directed outlet openings 13 of the outer tube 11 can be seen at the 1 o'clock position. Moreover, a spacer element 26 which is arranged between the inner tube 12 and the outer tube 11 and holds the two tubes 11, 12 of the feed device 9 at a predefined spacing from one another is visible in FIG. 6.

FIG. 7 shows an enlarged detail of the sectional illustration from FIG. 5.

FIG. 7 shows a part of the inner tube 12 and a part of the outer tube 11 of the feed device 9, a plurality of the downwardly oriented outlet openings 14 of the inner tube 12 and some of the upwardly oriented outlet openings 13 of the outer tube 11 being visible.

Through the downwardly directed outlet openings 14 of the inner tube 12, the treatment solution 4 is introduced into the outer tube 11, more precisely into the gap between the inner tube 12 and the outer tube 11, with the separation of gas bubbles. The gas bubbles collect in the upper part of the inner tube 11. Therefore, treatment solution 4 which is low in gas bubbles or free from gas bubbles passes to the upwardly directed outlet openings 13.

The invention has been described in detail on the basis of the exemplary embodiment which is shown. Nevertheless, the invention is not restricted to or by the disclosed example. Other variants can be derived from said exemplary embodiment by a person skilled in the art, without deviating from the concept which forms the basis of the invention.

LIST OF DESIGNATIONS

1 Treatment apparatus
2 Object
3 Basin
4 Treatment solution
5 Transport apparatus
6 Transport direction
7 Track
8 Transport roller
9 Feed device
10 Straight extent
11 Outer tube
12 Inner tube
13 Upwardly directed outlet opening 14 Downwardly directed outlet opening
15 Supply device
16 Supply line
17 Connector unit
18 Degassing device
19 Discharge line
20 Connector unit
21 Basin edge
22 Transport plane
23 Downwardly pointing surface
24 Treatment solution jet
25 Longitudinal extent direction
26 Spacer element
L Length

The invention claimed is:

1. A treatment apparatus comprising:
a basin configured to hold a treatment solution;
a transport apparatus configured to transport objects to be treated in a transport direction through the basin;
at least one feed device arranged in said basin and configured for treatment solution to be introduced into said basin; and
said at least one feed device having upwardly directed outlet openings for spraying the treatment solution upward, and said at least one feed device having a straight extent, at least in sections, which is oriented obliquely with respect to the transport direction; and
said treatment apparatus being configured to transport the objects to be treated in a plurality of tracks next to one another along the transport direction, and said at least one feed device is one of a plurality of feed devices, the treatment apparatus in each case having a dedicated feed device for each track; and
the treatment apparatus being configured for carrying out a method of treating objects, having the steps of:
 introducing a treatment solution into a basin by way of a feed device which includes upwardly directed outlet openings;
 spraying the treatment solution upward from the upwardly directed outlet openings, thus forming treatment solution jets;
 transporting objects to be treated through the basin with a transport apparatus, and thereby moving the objects through the basin above the upwardly directed outlet openings, and
 during a transport of the objects through the basin, bringing a downwardly pointing surface of the objects into contact with the treatment solution jets;
said straight extent of said at least one feed device extending over an entire length of the at least one feed device;
said at least one feed device being configured to generate treatment solution jets which widen conically from the upwardly directed outlet openings;
the straight extent being oriented at an angle α with respect to the transport direction, and the angle α is at least approximately:

$$\alpha = \arcsin((B-2R)/L);$$

where: L is a length of the at least one feed device, B is a width of the objects to be treated, and R is a radius of the treatment solution jets at a level of a transport plane of the transport apparatus.

2. The treatment apparatus according to claim 1, wherein said at least one feed device extends in said basin at least in sections in a non-parallel direction with respect to the transport direction.

3. The treatment apparatus according to claim 2, wherein said at least one feed device extends in the non-parallel direction with respect to the transport direction completely through the basin.

4. The treatment apparatus according to claim 1, wherein said at least one feed device has a plurality of upwardly directed outlet openings which are spaced apart from one another in a longitudinal extent direction of the at least one feed device.

5. The treatment apparatus according to claim 1, wherein said at least one feed device is a tube-in-tube system with an outer tube and an inner tube inside said outer tube, the outer tube having said upwardly directed outlet openings for spraying out the treatment solution upward, and said inner tube having downwardly directed outlet openings configured to introduce the treatment solution into said outer tube.

6. The treatment apparatus according to claim 1, wherein said least one feed device has a plurality of upwardly directed outlet openings which are arranged next to one another obliquely or perpendicularly with respect to the transport direction for spraying out the treatment solution upward.

7. The treatment apparatus according to claim 1, wherein said transport apparatus has a plurality of transport rollers which are arranged one behind another in the transport direction, said at least one feed device is arranged below said transport rollers, and said upwardly directed outlet openings of said at least one feed device are arranged at positions of said transport rollers, in relation to the transport direction.

8. The treatment apparatus according to claim 1, further comprising a degassing apparatus for removing gas bubbles and/or gas bubble-rich treatment solution from said at least one feed device, said degassing apparatus having a discharge line connected to said at least one feed device.

9. The treatment apparatus according to claim 1, wherein said plurality of feed devices are structurally identical devices.

* * * * *